US010250263B2

(12) United States Patent
Luo et al.

(10) Patent No.: US 10,250,263 B2
(45) Date of Patent: Apr. 2, 2019

(54) REPLICA CASCODE BIAS VOLTAGE-CONTROLLED OSCILLATORS (71) Applicant: Lattice Semiconductor Corporation, Portland, OR (US)

(72) Inventors: Kexin Luo, Shanghai (CN); Rui Yin, Shanghai (CN); Xiaofeng Wang, Shanghai (CN); Jie Yuan, Shanghai (CN); Qiming Wu, Shanghai (CN); Fei Song, Shanghai (CN); Min-Kyu Kim, Sunnyvale, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 15/114,394

(22) PCT Filed: May 12, 2015

(86) PCT No.: PCT/CN2015/078737
§ 371 (c)(1),
(2) Date: Jul. 26, 2016

(87) PCT Pub. No.: WO2016/179789
PCT Pub. Date: Nov. 17, 2016

(65) Prior Publication Data
US 2017/0149437 A1 May 25, 2017

(51) Int. Cl.
*H03L 7/00* (2006.01)
*H03K 3/011* (2006.01)
(Continued)

(52) U.S. Cl.
CPC ................ *H03L 7/00* (2013.01); *H03B 5/04* (2013.01); *H03K 3/011* (2013.01); *H03K 3/0231* (2013.01);
(Continued)

(58) Field of Classification Search
CPC ........ H03K 3/0231; H03K 3/011; H03K 3/03; H03L 7/00; H03L 1/00; H03L 7/093; H03B 5/04
(Continued)

(56) References Cited

U.S. PATENT DOCUMENTS 5,399,995 A * 3/1995 Kardontchik ........ H03K 3/0231
331/1 A
7,965,145 B2 6/2011 Kim et al.
(Continued)

FOREIGN PATENT DOCUMENTS

CN 1780150 A 5/2006
CN 101630958 A 1/2010

OTHER PUBLICATIONS

PCT International Search Report and Written Opinion, PCT/CN2015/078737, dated Sep. 29, 2015, 12 Pages.

*Primary Examiner* — Arnold Kinkead
(74) *Attorney, Agent, or Firm* — Fenwick & West LLP (57) ABSTRACT Embodiments relate to a voltage oscillator (VCO) that uses a replica bias circuit to generate a cascode bias voltage. The VCO generate an output periodic signal having a frequency and phase that is less or not susceptible to voltage swings by using a bias voltage generated in a replica bias circuit that replicates a voltage-to-current converter in the VOC. The bias voltage is generated and regulated according to a power supply voltage that supplies power to the VCO to account for voltage variations in the power supply voltage.

13 Claims, 5 Drawing Sheets (51) Int. Cl.
*H03B 5/04* (2006.01)
*H03L 1/00* (2006.01)
*H03L 7/093* (2006.01)
*H03K 3/03* (2006.01)
*H03K 3/0231* (2006.01)
*H03L 7/099* (2006.01)

(52) U.S. Cl.
CPC ................ *H03K 3/03* (2013.01); *H03L 1/00* (2013.01); *H03L 7/093* (2013.01); *H03L 7/099* (2013.01)

(58) Field of Classification Search
USPC .............................. 331/16, 17, 183, 185, 57
See application file for complete search history.

(56) References Cited

U.S. PATENT DOCUMENTS

| | | |
|---|---|---|
| 2007/0132491 A1 | 6/2007 | Kuo et al. |
| 2010/0013563 A1 | 1/2010 | Kim et al. |
| 2015/0002219 A1* | 1/2015 | Araki .................. H03K 17/962 327/543 |

* cited by examiner

REPLICA CASCODE BIAS VOLTAGE-CONTROLLED OSCILLATORS

BACKGROUND

1. Field of the Disclosure

This disclosure pertains to microelectronic circuits, and more specifically to low voltage and high power-supply-rejection ratio (PSRR) voltage-controlled oscillators (VCOs).

2. Description of the Related Art

Voltage controlled oscillators (VCOs) are electronic circuits having the output oscillation frequency that is a function of the input voltage. VCOs are widely used in many applications such as various communication circuits to generate synchronization signals. For example, VCOs are important basic building blocks in phase lock loops (PLL) that generate an output signal of which the phase is related to the phase of the input signal. VCOs are needed to generate clock frequencies for different functional blocks such as general purpose processor/memory clocks, analog to digital and digital to analog conversion clocks, digital signal processing clocks, etc.

To maintain proper signal integrity in these applications, VCOs' outputs need to exhibit sufficiently low jitter. However, power supplies are not noise free and VCOs tend to be sensitive to noise in the supply voltage. VCOs with low power-supply-rejection ratio (PSRR) may cause excess jitter in the VCO output and fail to meet clock timing-jitter requirements. For example, such timing-jitter may increase the bit error-rate of a communication system in which the VCO is implemented. In addition, the VCO output may be subject to excessive phase noise and violate clock phase-noise requirements. Phase noise refers to random fluctuations in a clock signal and may cause cross-talk or increased bit error-rates in communications systems where the VCO is implemented.

SUMMARY

Embodiments of the present disclosure are related to voltage oscillators that have high PSRR and low output noise. In one embodiment, the voltage oscillator includes a voltage-to-current configured to generate a control current responsive to receiving a control voltage. The voltage-to-current converter includes a first transistor and a second transistor, a drain of the first transistor coupled to a source of the second transistor and a gate of the second transistor biased by a bias voltage. The voltage oscillator also includes a current controlled oscillator coupled to the voltage-to-current converter. The current controlled oscillator is configured to receive the control current and to generate a periodic output signal having a frequency corresponding to the control current. In addition, the voltage oscillator includes a bias voltage generation circuit coupled to the voltage-to-current converter. The bias voltage generation circuit includes a replica bias circuit configured to generate a replica voltage corresponding to a voltage at the source of the second transistor.

In one embodiment, a method of generating a periodic signal includes generating, by a voltage-to-current converter, a control current responsive to receiving a control voltage. The method also includes providing the generated control current to a current controlled oscillator to generate the periodic signal. The method further includes generating, by a bias voltage generation circuit, a replica voltage corresponding to a voltage between a first transistor of the voltage-to-current converter and a second transistor of the voltage-to-current converter in a cascode configuration responsive to receiving the control voltage at a gate of the first transistor. The method includes generating, by the bias voltage generation circuit, a bias voltage by amplifying a difference between the replica voltage and a reference voltage. The method includes applying the generated bias voltage to a gate of the second transistor of the voltage-to-current converter and a gate of a third transistor in the bias voltage generation circuit corresponding to the second transistor of the voltage-to-current converter.

In one embodiment, a non-transitory computer readable storage medium storing digital representation of a voltage oscillator, the voltage oscillator includes a voltage-to-current configured to generate a control current responsive to receiving a control voltage. The voltage-to-current converter includes a first transistor and a second transistor, a drain of the first transistor coupled to a source of the second transistor and a gate of the second transistor biased by a bias voltage. The voltage oscillator also includes a current controlled oscillator coupled to the voltage-to-current converter. The current controlled oscillator is configured to receive the control current and to generate a periodic output signal having a frequency corresponding to the control current. In addition, the voltage oscillator includes a bias voltage generation circuit coupled to the voltage-to-current converter. The bias voltage generation circuit includes a replica bias circuit configured to generate a replica voltage corresponding to a voltage at the source of the second transistor.

BRIEF DESCRIPTION OF THE DRAWINGS

The teachings of the embodiments disclosed herein can be readily understood by considering the following detailed description in conjunction with the accompanying drawings.

DETAILED DESCRIPTION

The Figures (FIG.) and the following description relate to various embodiments by way of illustration only. It should be noted that from the following discussion, alternative embodiments of the structures and methods disclosed herein will be readily recognized as viable alternatives that may be employed without departing from the principles discussed herein.

Reference will now be made in detail to several embodiments, examples of which are illustrated in the accompanying figures. It is noted that wherever practicable similar or like reference numbers may be used in the figures and may indicate similar or like functionality.

Embodiments relate to a voltage oscillator (VCO) that uses a replica bias circuit to generate a cascode bias voltage. The VCO generates an output periodic signal having a frequency and phase that is less or not susceptible to voltage swings by using a bias voltage generated by a bias generation circuit including a replica bias circuit that replicates a voltage-to-current converter in the VCO. The bias voltage is generated and regulated according to a power supply voltage that supplies power to the VCO to account for voltage variations in the power supply voltage.

Embodiments described herein may be used for various systems using standards that include, but not limited to, High-Definition Multimedia Interface (HDMI), Digital Visual Interface (DVI), Mobile High-Definition Link (MHL), DisplayPort, Universal Serial Bus (USB), Bluetooth, etc. In an integrated circuit, a voltage oscillator (VCO) circuit block shares power connections with other digital and analog circuit blocks. The VCO may generate any number of clock signals required to operate multiple circuit blocks within the integrated circuit or sent to external circuits and signal interfaces. The VCO may be customized for different frequency ranges and jitter specifications. As an integrated circuit must be designed with supply voltages as low as possible to operate with minimal power consumption and within the breakdown voltage of the silicon process, it is particularly difficult for the VCO to meet the stringent timing jitter and phase noise requirements of low-voltage and high-frequency or date-rate systems.

Figure 1:
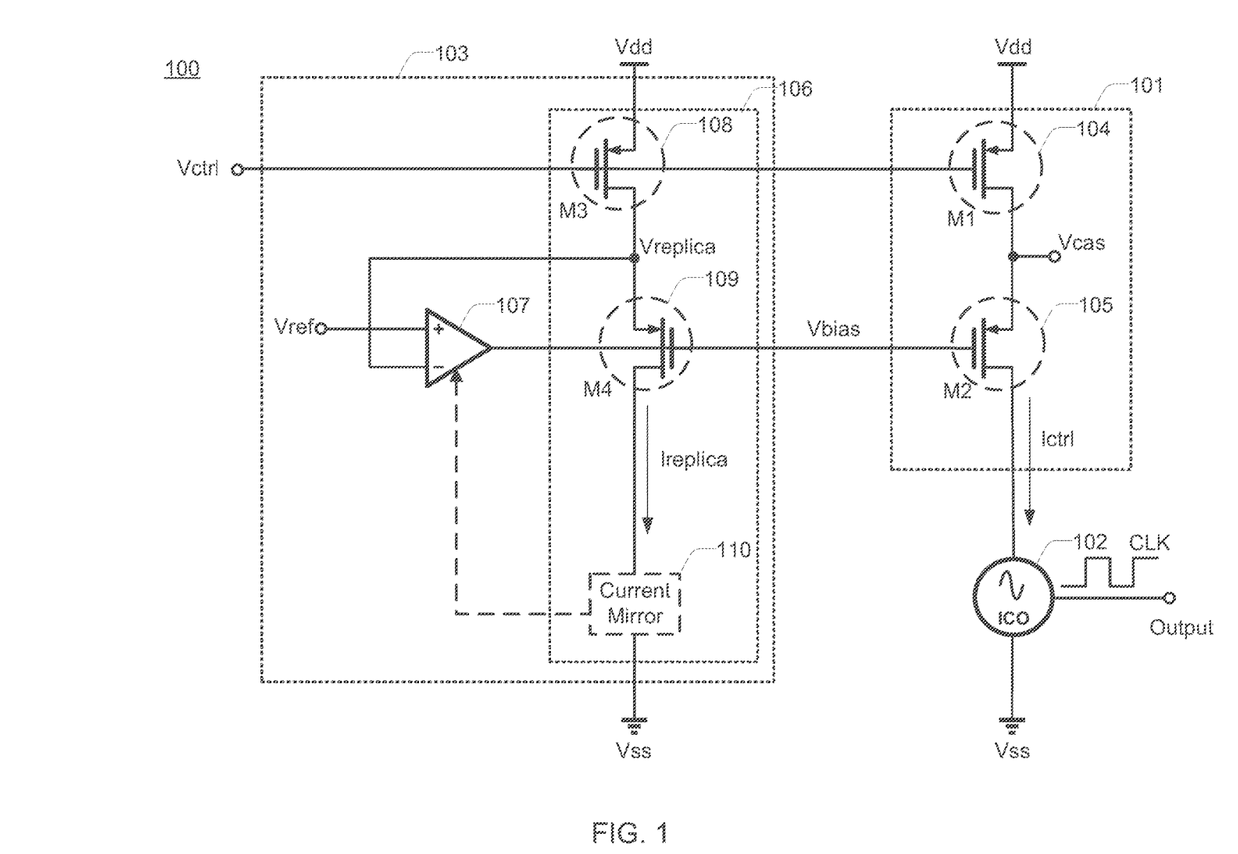
FIG. 1 illustrates a circuit diagram of a replica cascode bias voltage controlled oscillators (VCO), according to one embodiment.

FIG. 1 illustrates a circuit diagram of a replica cascode bias VCO 100, according to one embodiment. The replica cascode bias VCO 100 may include, among other components, a voltage-to-current converter 101, a current controlled oscillator 102, and a bias voltage generation circuit 103. The replica cascode bias VCO 100 may be supplied with a power supply having a positive supply voltage Vdd and a negative supply voltage Vss (i.e., ground). The replica cascode bias VCO 100 receives an input voltage Vctrl and outputs a periodic output signal CLK corresponding to the input voltage Vctrl via an intermediate control current Ictrl.

The amplitude of the intermediate control current Ictrl varies with the input voltage Vctrl. Specifically, the amplitude of the control current Ictrl increases or decreases when the amplitude of the input voltage Vctrl increases or decreases, respectively. As a result, the frequency of the periodic output signal CLK increases or decreases when the amplitude of the input voltage Vctrl increases or decreases, respectively. The input voltage Vctrl may be received from a loop filter (not shown). The loop filter may receive a signal indicating that the frequency of the periodic output signal CLK is either above or below the desired frequency at each phase comparison cycle with an input periodic signal.

The voltage-to-current converter 101 is a circuit that generates the control current Ictrl corresponding to the control voltage Vctrl. To enable the voltage-to-current converter 101 to generate a stable control current Ictrl despite fluctuations in the positive power supply voltage Vdd, the voltage-to-current converter 101 is biased by a bias voltage Vbias to ensure the transistor M1 104 operates in its saturation region. This is because the voltage Veas at the drain (or collector) of the transistor M1 104 is the difference between the bias voltage Vbias and the gate-to-source voltage Vgs of the transistor M2 105. The transistors M1 104 and M2 105 both need to operate in their saturation regions. By providing a bias voltage Vbias that is regulated in reference to the power supply voltage, the output impedance of the replica cascode bias VCO is thereby increased. Accordingly, the frequency of the output periodic signal CLK is less or not susceptible to voltage swings in the power supply voltage Vdd and the overall PSRR of the replica cascode bias VCO 100 is improved. Because the input voltage Vctrl is the voltage at one terminal of the output capacitor of the loop filter (not shown) and the other terminal of the output capacitor is coupled to the power supply voltage Vdd, the input voltage Vctrl varies with the positive power supply voltage Vdd and causes the amplitude of the control current Ictrl to also vary with the positive power supply voltage Vdd. The bias voltage Vbias may be regulated according to the positive power supply voltage Vdd to account for the fluctuations in the positive power supply voltage Vdd.

In the embodiment of FIG. 1, the voltage-to-current converter 101 includes a transistor M1 104 and a transistor M2 105 arranged in a cascode configuration coupled between the positive power supply voltage Vdd and the negative power supply voltage Vss (i.e., ground). The drain (or collector) of the transistor M1 104 is coupled to the source (or emitter) of the transistor M2 105. The source (or emitter) of the transistor M1 104 is coupled to the positive power supply voltage Vdd. The drain (or collector) of the transistor M2 is the output of the voltage-to-current converter 101 and is coupled to the current controlled oscillator 102. The voltage-to-current converter 101 may receive an input voltage Vctrl and a bias voltage Vbias. For example, the gate of the transistor M1 receives the input voltage Vctrl and the gate of the transistor M2 receives the bias voltage Vbias. Because the transistor M1 104 and the transistor M2 105 are arranged in a cascode configuration, the bias voltage Vbias is provided to the gate of the transistor M2 to ensure voltage-to-current converter 101 operates properly. The output impedance of the voltage-to-current converter 101 is increased by the cascode configuration between the transistor M1 104 and the transistor M2 105.

The bias voltage generation circuit 103 functions to regulate and provide the bias voltage Vbias to the current converter 101, and thereby to improve the overall PSRR of the replica cascode bias VCO 100. The bias voltage generation circuit 103 includes a replica bias circuit 106 and an amplifier 107 that form a feedback loop. The replica bias circuit 106 replicates the voltage-to-current converter 101 and provides a signal (i.e., Vreplica) to an inverting input of the amplifier 107. Instead of the voltage-to-current converter 100 directly providing a signal (i.e., Vcas) to the amplifier 107, a replica signal (i.e., Vreplica) generated by the replica bias circuit 106 of the bias voltage generation circuit 103 is provided to the amplifier 107 of the bias voltage generation circuit 103. Such configuration increases the output impedance of the replica cascode bias VCO 100 thereby to reduce or eliminate noise that may be introduced by the amplifier 107.

The replica bias circuit 106 generates a replica voltage Vreplica and a replica current Ireplica. The replica current Ireplica generated by the replica bias circuit 106 is a replicated version of the control current Ictrl generated by the voltage-to-current converter 101. The replica bias circuit 106 provides the replica voltage Vreplica to the amplifier 107. The replica voltage Vreplica is a replicated version of the voltage Vcas at the source (or emitter) of the transistor M2 105. In other words, the replica voltage Vreplica is the same as the voltage Vcas. The amplifier 107 compares the replica voltage Vreplica to a reference voltage Vref to regulate the bias voltage Vbias. The bias voltage Vbias may be regulated in reference to the positive power supply voltage Vdd and thereby account for the fluctuations in the positive power supply voltage Vdd.

The amplifier 107 increases the loop gain of the replica cascode bias VCO 100 thereby to increase the output impedance of the replica cascode bias VCO 100. The amplifier 107 receives the reference voltage Vref at its non-inverting input and the replica voltage Vreplica at its inverting input. The amplifier 107 generates the bias voltage Vbias by amplifying a voltage error between the reference voltage Vref and the replica voltage Vreplica as its output. The replica voltage Vreplica is configured to track the reference voltage Vref. Because the replica voltage Vreplica is a replica of the voltage Vcas, the reference voltage Vref equals to the difference between the bias voltage Vbias and the gate-to-source voltage of the transistor M2 105. In some embodiments, the bias voltage generation circuit 103 generates a reference voltage Vref. The reference voltage Vref determines the drain-to-source (or collector-to-emitter) voltage Vds of the transistor M1 104. In low voltage applications, the Vds of the transistor M1 104 is usually, for example, 200 mV.

The replica bias circuit 106 includes a transistor M3 108 and a transistor M4 109, arranged in a cascode configuration. That is, the drain (or collector) of the transistor M3 108 is coupled to the source (or emitter) of the transistor M4 109, both of which are coupled to the inverting input of the amplifier 107. The source (or emitter) of the transistor M3 108 may be coupled to the positive power supply voltage Vdd and the drain (or collector) of the transistor M4 109 may be coupled to the negative power supply voltage Vss (i.e., grounded). The gate of the transistor M4 109 is coupled to the output of the amplifier 107. As illustrated, the gate of the transistor M2 105 is coupled to the gate of the transistor M4 109 that is a replica of the transistor M2 105, and the gate of the transistor M1 104 is coupled to the gate of the transistor M3 108. In the illustrated voltage-to-current converter 101, the gate of the transistor M2 105 is coupled to the output of the bias voltage generation circuit 103 to receive the bias voltage Vbias.

In some embodiments, the replica bias circuit 106 may comprise a current mirror 110 coupled between the replica bias circuit 106 and the negative output of the power supply Vss. The current mirror 110 is configured to provide an amplifier bias voltage to the amplifier 107 to ensure the amplifier 107 operates properly.

By amplifying the voltage error between the reference voltage Vref and the replica voltage Vreplica and using a feedback loop including the amplifier 107 to generate the bias voltage Vbias, the voltage-to-current converter 101 generates a control current Ictrl that is less susceptible to voltage swings in the positive power supply voltage Vdd, as described below in detail with reference to FIG. 3. The feedback loop including the amplifier 107 increases the output impedance of the voltage-to-current converter 101. Accordingly, the control current Ictrl is less susceptible to voltage swings in the positive power supply voltage Vdd. As a result, the frequency of the output periodic signal CLK is also less susceptible to voltage swings in the positive power supply voltage Vdd. The overall PSRR and noise performance of the replica cascode bias VCO 100 is thereby improved. The periodic output signal CLK generated by the replica cascode bias VCO 100 has low jitter and low phase noise.

Moreover, the bias voltage generation circuit 103 does not significantly impact the overall noise performance of the replica cascode bias VCO 100. Any noise introduced by the bias voltage generation circuit 103 appears at the gate of the transistor M2 105, and hence, the bias voltage generation circuit 103 does not directly withdraw from or inject into the control current Ictrl any noise that may affect the frequency and the phase of the output periodic signal CLK. Furthermore, the output impedance of the voltage-to-current converter 101 is also increased by the bias voltage generation circuit 103. When the output impedance is increased above a predetermined value, any noise appearing at the gate of the transistor M2 105 has a minimal effect on the amplitude and phase of the control current Ictrl. As a result of separating the bias voltage generation circuit 103 and increasing the output impedance of the voltage-to-current converter 101, the overall noise performance of the replica cascode bias VCO 100 is improved.

Figure 2:
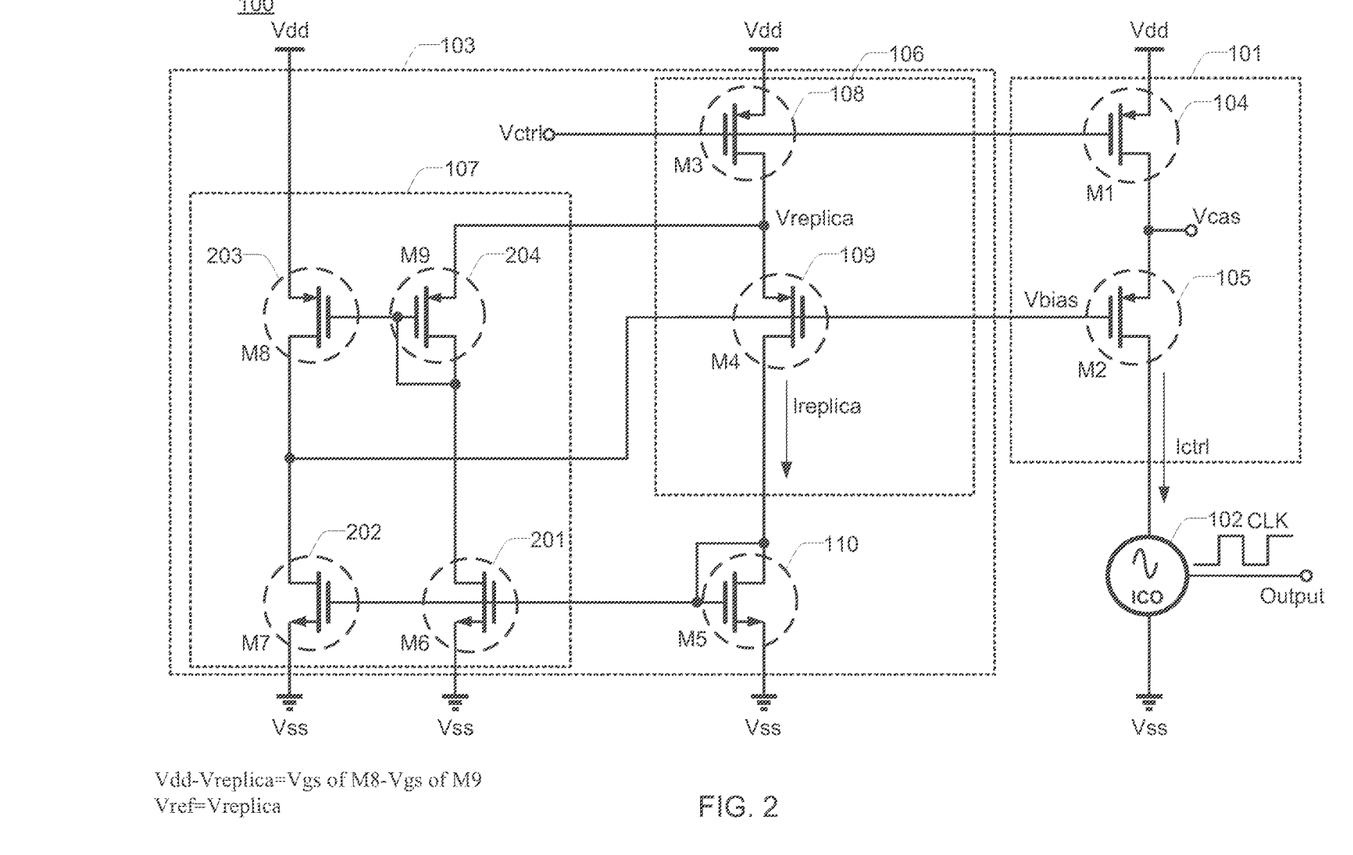
FIG. 2 illustrates a circuit diagram of a replica cascode bias VCO, according to one embodiment.

FIG. 2 illustrates a detailed circuit diagram of a replica cascode bias VCO 100, according to one embodiment. The replica cascode bias VCO 100 of FIG. 2 may include, among other components, a voltage-to-current converter 101, a current controlled oscillator 102, and a bias voltage generation circuit 103, as also described above with reference to FIG. 1. The function and operation of the voltage-to-current converter 101, the current controlled oscillator 102 and the bias generation circuit 103 are described above with reference to FIG. 1, and therefore, omitted herein for the sake of brevity.

As described above with reference to FIG. 1, the replica current Ireplica at the drain (or collector) of the transistor M4 109 is a replica of the control current Ictrl. The drain (or collector) of the transistor M5 205 is coupled to the drain (or collector) of the transistor M4 109, and its gate and the drain (or collector) connected to form a current mirror. Transistor M5 205 corresponds to the current mirror 110 and functions to provide a current to the amplifier 107. The replica current Ireplica is provided to the transistor M5, the gate and drain (or collector) of which are shortened. The transistor M5 generates an amplifier bias voltage to bias the transistors M6 and M7 and to control the current through the transistors M6 and M7.

The amplifier 107 includes transistors M6 through M9. As illustrated in FIG. 2, the gates of the transistors M8 203 and M9 204 are coupled together. The source (or emitter) of the transistor M8 203 may be coupled to the positive power supply voltage Vdd, and the source (or emitter) of the transistor M9 204 is coupled to the drain (or collector) of the transistors M3 108 and coupled to the source (or emitter) of the transistor M4 109. In addition, the gate and the drain (or collector) of the transistor M9 204 are coupled together. Moreover, the drain (or collector) of the transistor M8 203 is coupled to the drain (or collector) of the transistor M7 202, and the drain (or collector) of the transistor M9 204 is coupled to the drain (or collector) of the transistor M6 201. The gates of the transistors M6-M7 201-202 are coupled together, which are further coupled to the gate of the transistor M5 205. The sources (or emitters) of the transistors M6-M7 201-202 may be coupled to the negative power supply voltage Vss (i.e., grounded.)

The bias voltage generation circuit 103 may generate the reference voltage Vref. In the illustrated example, the transistors M8 and M9 of the amplifier 107 generate the reference voltage Vref. The reference voltage Vref equals to the replica voltage Vreplica, which determines the drain-to-source (or collector-to-emitter) voltage Vds of the transistor M1. The difference between the positive power supply voltage Vdd and the replica voltage Vreplica equals to the difference between the gate-to-source voltage Vgs of the transistor M8 203 and that of the transistor M9 204. The gate-to-source voltage Vgs of the transistor M8 203 is greater than that of the transistor M9 204. The transistor M3 108 operates as a current source that provides current to the transistors M5 through M7, and the transistor M6 201 operates as a current source that provides current to the transistor M9 204, and the transistor M7 202 provides current to the transistor M8 203. The transistor M9 204 operates as a voltage shifter and the drain voltage (i.e., the replica voltage Vreplica) of the transistor M3 108 is shifted down by the gate-to-source voltage Vgs of the transistor M9 204. The replica voltage Vreplica is an accurate replica of the source voltage Vcas of the transistor M2 105 and the difference between the gate-to-source voltage Vgs of the transistor M8 203 and that of the transistor M9 204 is the difference between the positive power supply voltage Vdd and the replica voltage Vreplica. The difference between the gate-to-source voltage Vgs of the transistor M8 203 and that of the transistor M9 204 thus determines the source voltage Vcas of the transistor M2 105. The transistor M8 operates as a single transistor amplifier that amplifies the voltage error between the reference voltage Vref and the source voltage Vcas of the transistor M2 105. The bias voltage Vbias equals to the difference between the replica voltage Vreplica and the gate-to-source voltage of the transistor M9.

Figure 3:
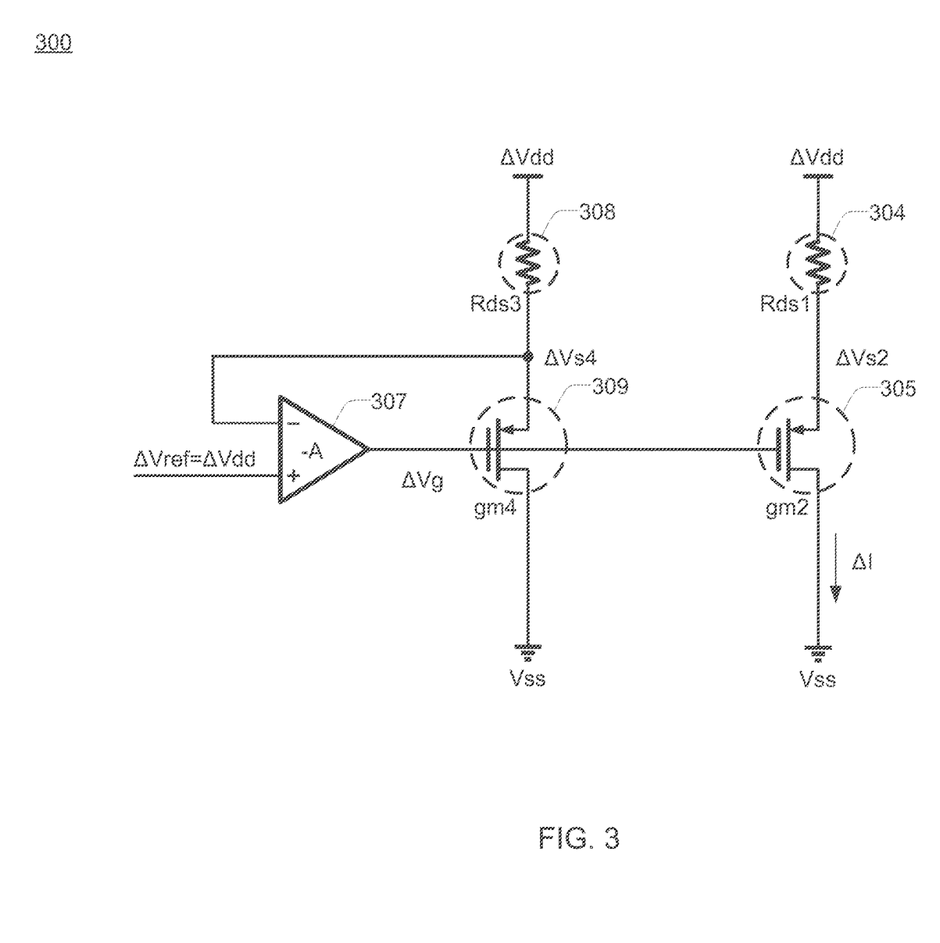
FIG. 3 is a small signal equivalent circuit diagram of an example replica cascode bias VCO, according to one embodiment.

FIG. 3 is a small signal equivalent circuit diagram of an example replica cascode bias VCO 300, according to one embodiment. In the illustrated example, the transistor M3 108 and M1 104 are represented by their respective output resistances Rds3 308 and Rds1 304, the transistors M4 109 and M2 105 are represented by their respective transconductances gnm4 309 and gm2 305, and the amplifier 107 is represented by an ideal amplifier 307. The ideal amplifier 307 has a gain A. A variation in the power supply voltage $\Delta Vdd$ causes the reference voltage Vref to change by $\Delta Vdd$, the output of the amplifier 107 to change $\Delta Vg$, and the current provided to the current controlled oscillator 102 to change by $\Delta I$. The ratio between the change in current $\Delta I$ provided to the current controlled oscillator 102 to the change in output voltage $\Delta Vdd$ of the replica cascode bias VCO 300 is expressed in the equation (1):

$$\frac{\Delta I}{\Delta Vdd} = \frac{\Delta Vdd - \Delta Vs2}{Rds1} * \frac{1}{\Delta Vdd} = \left(1 - \frac{A*gm4*Rds3}{gm4*Rds3*A + 1 + gm4*Rds3} * \frac{Rds1}{Rds1 + \frac{1}{gm2}}\right) * \frac{1}{Rds1}. \quad (1)$$

Because $$\frac{Rds1}{Rds1 + \frac{1}{gm2}} \approx 1,$$

the ratio between the change in current through the current source $\Delta I$ to the change in output voltage $\Delta Vamp$ of the replica cascode bias VCO 300 may be further determined according to Equation (2):

$$\frac{\Delta I}{\Delta Vdd} \approx \left(1 - \frac{A*gm4*Rds3}{gm4*Rds3*A + 1 + gm4*Rds3}\right) * \frac{1}{Rds1} \approx \frac{1}{A} * \frac{1}{Rds1}. \quad (2)$$

According to Equation (2), the current variation $\Delta I$ caused by the power supply variation $\Delta Vdd$ of the example replica cascode bias VCO 300 is inversely proportional to the gain of the ideal amplifier 307 as well as the resistance of the transistor M3 108. As the current variation $\Delta I$ may cause the frequency variation in the output of the replica gain-boosting cascode bias, the PSRR of the example replica cascode bias VCO 300 is improved.

Figure 4:
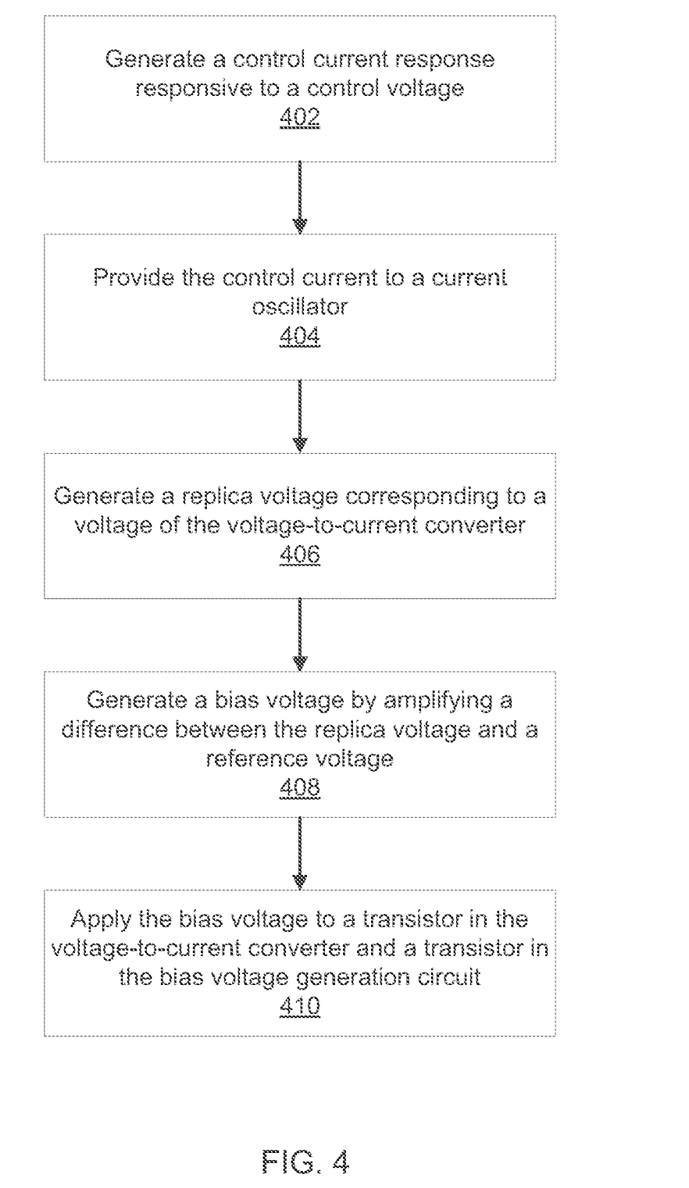
FIG. 4 is a flow chart of a method of generating a periodic output signal in response to an input control voltage, according to one embodiment.

FIG. 4 is a flow chart of generating a periodic output signal in response to an input control voltage, according to one embodiment. A voltage-to-current converter generates 402 a control current responsive to a control voltage. The voltage-to-current converter includes a first transistor and a second transistor arranged in a cascode configuration coupled between the positive power supply voltage Vdd and the negative power supply voltage Vss (i.e., ground). The input control voltage Vctrl may be provided to the gate of the first transistor, which conducts in response to the input control voltage Vctrl. The voltage-to-current converter may receive a bias voltage Vbias that is provided to the gate of the second transistor which conducts in response to the bias voltage Vbias. The control current is provided 404 to a current controlled oscillator to generate the periodic signal.

A bias voltage generation circuit generates 406 a replica voltage. The replica voltage corresponds to a voltage between the first transistor and a second transistor in the voltage-to-current converter. The bias voltage generation circuit includes a replica bias circuit that replicates the voltage-to-current converter. The replica bias circuit includes a third transistor and a fourth transistor arranged in a cascode configuration. The gate of the third transistor is coupled to the gate of the first transistor and receives the input control voltage. The gate of the fourth transistor is coupled to the gate of the second transistor and receives a bias voltage. The replica bias circuit may also generate a replica current corresponding to the control current.

The bias voltage generation circuit generates 408 a bias voltage by amplifying a difference between the replica voltage and a reference voltage. The bias voltage generation circuit includes an amplifier of which the inverting input receives the replica voltage and the non-inverting input receives a reference voltage. The amplifier amplifies a voltage difference between the replica voltage and the reference voltage to generate the bias voltage. The amplifier may operate in a current mode. The bias voltage generation circuit may include a current mirror coupled to the replica bias circuit. The current mirror generates a mirror current mirroring the replica current and provides the mirror current to the amplifier. The amplifier includes a fifth transistor and a sixth transistor, the gates of which are connected. The mirror current may be provided to both the fifth transistor and the sixth transistor. The gate and the drain (or collector) of the fifth transistor are connected and the fifth transistor shifts the replica voltage by its gate-to-source (or -emitter) voltage. The sixth transistor amplifies the voltage difference between the replica voltage and the reference voltage, which is the difference between the gate-to-source (or -emitter) voltage of the sixth transistor and that of the fifth transistor. The voltage at the drain (or collector) of the sixth transistor is the bias voltage.

The bias voltage is provided 410 to the gate of the second transistor of the voltage-to-current converter and a gate of a transistor in the bias voltage generation circuit, that replicates the second transistor. As such, the replica bias circuit and the amplifier are arranged in a feedback configuration. Details of the method are provided with references to FIGS. 1 through 3.

Figure 5:
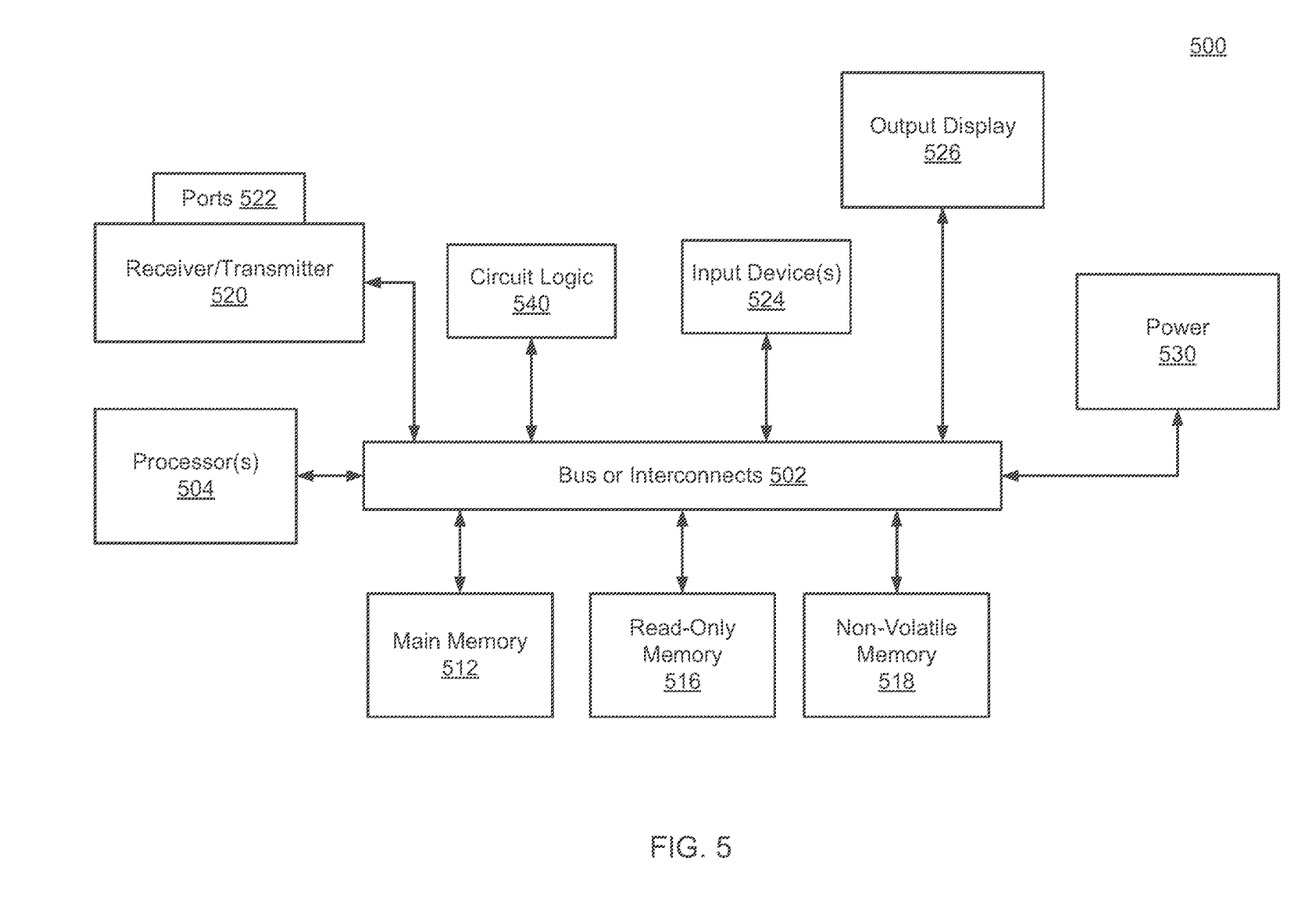
FIG. 5 is a block diagram illustrating an electronic device that stores a representation of a replica cascode bias VCO, according to one embodiment.

FIG. 5 is a block diagram of a special-purpose computing device that can store a representation of a replica cascode bias VCO, according to one embodiment. In one embodiment, a representation of a replica cascode bias VCO or components within the replica cascode bias VCO can be stored as data at in a non-transitory computer-readable medium (e.g., non-volatile memory 518). The representation can be at a behavioral level, register transfer level, logic component level, transistor level, and layout geometry-level of the replica cascode bias VCO.

In some embodiments, computer 500 comprises an interconnect or bus 502 (or other communication means) for transmission of data. Computer 500 can include a processing means such as one or more processors 504 coupled with bus 502 for processing information. Processors 504 can comprise one or more physical processors and/or one or more logical processors. While bus 502 is illustrated as a single interconnect for simplicity, it is understood that bus 502 can represent multiple different interconnects or buses. Bus 502 shown in FIG. 5 is an abstraction that represents any one or more separate physical buses, point to point connections, or both connected by appropriate bridges, adapters, controllers and/or the like.

In some embodiments, computer 500 further comprises a random access memory (RAM) or other dynamic storage device depicted as main memory 512 for storing information and instructions to be executed by processors 504. Main memory 512 can include an active storage of applications including a browser application for using in network browsing activities by a user of computer 500. Main memory 512 can further include certain registers or other special purpose memory.

Computer 500 can also comprise a read only memory (ROM) 516 or other static storage device for storing static information and instructions for processors 504. Computer 500 can further include one or more non-volatile memory elements 518 for the storage of certain elements, including, for example, flash memory, a hard disk, solid-state drive. Non-volatile memory elements 518 can store a representation of a replica cascode bias VCO described above with references to FIGS. 1 through 4, or components within the replica cascode bias VCO, can be stored as data. The representation can be at a behavioral level, register transfer level, logic component level, transistor level, and layout geometry-level of the replica cascode bias VCO.

Computer 500 can comprise transceiver module 520 that is coupled to bus 502. Transceiver module 520 can further comprise a transmitter module and a receiver module. Transceiver module 520 comprises one or more ports 522 to connect to other devices (not shown).

Computer 500 can also comprise circuit logic 540 coupled to bus 502 and configured to detect information from a second device (not shown) coupled through ports 522. Computer 500 can also comprise output display 526 and coupled via bus 502. In some embodiments, display 526 can include a liquid crystal display (LCD) or any other display technology, for displaying information or content to a user, including three-dimensional (3D) displays. Alternatively, display 526 can include a touch screen that can also be part of input device 524. In some environments, display 526 can include an audio device, such as a speaker for providing audio information. Computer 500 can also comprise power device 530 that can comprise a power supply, a battery, a solar cell, a fuel cell, or other device for providing or generating power. Any power provided by power device 530 can be distributed as required to elements of computer 500.

While particular embodiments and applications of the present disclosure have been illustrated and described, it is to be understood that the embodiments are not limited to the precise construction and components disclosed herein and that various modifications, changes and variations may be made in the arrangement, operation and details of the method and apparatus of the present disclosure disclosed herein without departing from the spirit and scope of the disclosure.

What is claimed is:

1. A voltage oscillator comprising:
    a voltage-to-current converter configured to generate a control current responsive to receiving a control voltage, the voltage-to-current converter comprising a first transistor and a second transistor, a drain of the first transistor coupled to a source of the second transistor and a gate of the second transistor biased by a bias voltage;
    a current controlled oscillator coupled to the voltage-to-current converter to receive the control current and to generate a periodic output signal having a frequency corresponding to the control current; and
    a bias voltage generation circuit coupled to the voltage-to-current converter, the bias voltage generation circuit comprising a replica bias circuit configured to generate a replica voltage corresponding to a voltage at the source of the second transistor.

2. The voltage oscillator of claim 1, wherein the bias voltage generation circuit further comprises an amplifier coupled to replica bias circuit to receive the output voltage and a reference voltage, the amplifier configured to generate the bias voltage representing an amplified difference between the replica voltage and the reference voltage.

3. The voltage oscillator of claim 2, wherein the reference voltage equals to the replica voltage.

4. The voltage oscillator of claim 1, wherein the replica bias circuit comprises a third transistor and a fourth transistor coupled to the third transistor, a gate of the first transistor is coupled to a gate of the third transistor, a drain of the third transistor is coupled to a source of the fourth transistor, and the gate of the second transistor is coupled to a gate of the fourth transistor.

5. The voltage oscillator of claim 4, wherein the replica bias circuit comprises a fifth transistor, a drain and a gate of the fifth transistor are coupled to the drain of the fourth transistor.

6. The voltage oscillator of claim 5, wherein the amplifier comprises:
    a sixth transistor;
    a seventh transistor having a gate coupled to a gate of the sixth transistor, and a source of the seventh transistor receiving the replica voltage;
    an eighth transistor having a drain coupled to a drain of the sixth transistor; and
    a ninth transistor having a gate coupled to a gate of the eighth transistor and having a drain coupled to a drain of the seventh transistor.

7. The voltage oscillator of claim 6, wherein a gate to source voltage of the sixth transistor and a gate to source voltage of the seventh transistor determines the reference voltage, and the gate to source voltage of the sixth transistor is greater than the gate to source voltage of the seventh transistor.

8. A method of generating a periodic signal, comprising:
    generating, by a voltage-to-current converter, a control current responsive to receiving a control voltage;
    providing the generated control current to a current controlled oscillator to generate the periodic signal;
    generating, by a bias voltage generation circuit, a replica voltage corresponding to a voltage between a first transistor of the voltage-to-current converter and a second transistor of the voltage-to-current converter in a cascode configuration responsive to receiving the control voltage at a gate of the first transistor;

generating, by the bias voltage generation circuit, a bias voltage by amplifying a difference between the replica voltage and a reference voltage; and applying the generated bias voltage to a gate of the second transistor of the voltage-to-current converter and a gate of a third transistor in the bias voltage generation circuit, the third transistor being a replica of the second transistor of the voltage-to-current converter.

9. The method of claim 8, further comprising:

providing the reference voltage to a non-inverting input of an amplifier in the bias generation circuit; and providing the reference voltage to an inverting input of the amplifier, the reference voltage corresponding to a drain to source voltage of the first transistor.

10. The method of claim 8, further comprising:

controlling a current through a fourth transistor of the bias generation circuit by providing the control voltage to the gate of the fourth transistor; and providing at least part of the current through the fourth transistor to a source of the third transistor in the bias voltage generation circuit.

11. The method of claim 10, further comprising:

conducting a replica current through the third transistor in the bias voltage generation circuit;

generating a mirror current mirroring the replica current at the current mirror responsive to receiving the replica current; and providing the mirror current to the amplifier.

12. The method of claim 11, further comprising:

shifting the replica voltage by a gate-to-source voltage of a fifth transistor of the amplifier; and providing the mirror current to a sixth transistor of the amplifier to amplify the difference between the replica voltage and the reference voltage.

13. The method of claim 12, further comprising generating, by the bias voltage generation circuit, a difference between a gate to source voltage of the sixth transistor and a gate to source voltage of the fifth transistor determining the reference voltage, the gate-to-source voltage of the sixth transistor greater than the gate-to-source voltage of the fifth transistor.

* * * * *